(12) United States Patent
Cohen et al.

(10) Patent No.: US 10,020,782 B2
(45) Date of Patent: Jul. 10, 2018

(54) PVT ROBUST CLOSED LOOP CMOS BIAS FOR LINEAR POWER AMPLIFIER

(71) Applicant: DSP Group LTD., Herzeliya (IL)

(72) Inventors: Avi Cohen, Bnei Dror (IL); Ron Pongratz, Tel Aviv (IL)

(73) Assignee: DSP GROUP LTD., Herzliya (IL)

( * ) Notice: Subject to any disclaimer, the term of this patent is extended or adjusted under 35 U.S.C. 154(b) by 0 days.

(21) Appl. No.: 15/286,616

(22) Filed: Oct. 6, 2016

(65) Prior Publication Data

US 2017/0104458 A1    Apr. 13, 2017

Related U.S. Application Data

(60) Provisional application No. 62/238,735, filed on Oct. 8, 2015.

(51) Int. Cl.
| | |
|---|---|
| *H03F 3/04* | (2006.01) |
| *H03F 1/30* | (2006.01) |
| *H03F 1/02* | (2006.01) |
| *H03F 3/345* | (2006.01) |
| *H03F 3/193* | (2006.01) |
| *H03F 3/24* | (2006.01) |

(52) U.S. Cl.
CPC ........... *H03F 1/301* (2013.01); *H03F 1/0216* (2013.01); *H03F 3/193* (2013.01); *H03F 3/245* (2013.01); *H03F 3/345* (2013.01); *H03F 2200/451* (2013.01); *H03F 2200/453* (2013.01)

(58) Field of Classification Search
CPC ....................................... H03F 1/223

USPC ......... 330/296, 285, 85, 127, 129, 295, 310, 330/311

See application file for complete search history.

(56) References Cited

U.S. PATENT DOCUMENTS

2014/0043102 A1* 2/2014 Su ........................... H03F 1/223
330/295

* cited by examiner

*Primary Examiner* — Khanh V Nguyen
*Assistant Examiner* — Khiem Nguyen
(74) *Attorney, Agent, or Firm* — Reches Patents

(57) ABSTRACT

A biasing device for direct current (DC) biasing a linear power amplifier that comprises multiple linear power amplifier circuits that are ideally identical to each other; wherein the biasing device may include a replica circuit that is a replica of a linear power amplifier circuit of the multiple linear power amplifier circuits; and a bias control circuit; wherein the bias control circuit is configured to feed the replica circuit with one or more DC biasing signals thereby maintaining at a constant value a replica DC current that is consumed by the replica circuit, and maintaining at a fixed value a replica DC voltage of a replica output node of the replica circuit; and wherein the replica circuit is coupled the multiple linear power amplifier circuits and is configured to supply DC voltage bias signals that force each linear power amplifier circuit of the multiple linear power amplifier circuits to consume a linear power amplifier circuit DC current that equals the replica DC current, when the linear power amplifier circuit is fed with a linear power amplifier DC voltage that either equals the replica DC voltage or differs from the replica DC voltage by a fraction of the replica DC voltage.

19 Claims, 5 Drawing Sheets

Feeding, by a biasing device, a replica circuit with one or more DC biasing signals thereby maintaining at a constant value a replica DC current that is consumed by the replica circuit, and maintaining at a fixed value a replica DC voltage of a replica output node of the replica circuit; wherein the replica circuit is a replica of a linear power amplifier circuit of the multiple linear power amplifier circuits; wherein the replica circuit is coupled to the multiple linear power amplifier circuits. 210

Supplying, by the replica circuit, supply DC voltage bias signals that force each linear power amplifier circuit of the multiple linear power amplifier circuits to consume a linear power amplifier circuit DC current that equals the replica DC current, when the linear power amplifier circuit is fed with a linear power amplifier DC voltage that either equals the replica DC voltage or exceeds the replica DC voltage by a fraction of the replica DC voltage. 220

PVT ROBUST CLOSED LOOP CMOS BIAS FOR LINEAR POWER AMPLIFIER

CROSS REFERENCE TO RELATED APPLICATIONS

This application claims priority from U.S. provisional patent application Ser. No. 62/238,735 filing date Oct. 8, 2015 which is incorporated herein by reference.

BACKGROUND

The growing demand for higher bit rate communication from radio frequency (RF) transceivers mandates the use of modulation code schemes (MCS) on the transmit side, that has high peak to average power ratio (PAPR) signal characteristic.

The high PAPR necessitates the use of a linear power amplifier (PA) characterized with poor efficiency.

The lack of available frequencies pushes the linear RF PA to higher frequencies and higher signal Band width (BW) which necessitates the use of fabrication technologies with transistor that have high Transition Frequency (FT) characteristic.

For CMOS technology, the higher (FT) is achieved by means of smaller and smaller geometry and lower supply voltage and threshold voltage (VT).

Trying to mitigate the poor efficiency in linear PA and coping with smaller dynamic range (DR) due to lower supply voltage in advanced CMOS technologies, designers tend to bias the PA transistors close to VT or even sub threshold operating condition, which makes the design more sensitive to process voltage and temperature (PVT) variations.

The use of minimum channel length in the PA transistors magnifies the sensitivity to PVT variation resulting in variant PA operation.

If constant current and gm is maintained in the PA transistors, PA sensitivity would greatly reduce.

Maintaining constant current and gm (conductance) on the PA must be done with minimal intrusion to the PA, in order to avoid influencing PA characteristics.

SUMMARY

There may be provided a biasing device for direct current (DC) biasing a linear power amplifier that may include multiple linear power amplifier circuits that may be ideally identical to each other. The biasing device may include a replica circuit that may be a replica of a linear power amplifier circuit of the multiple linear power amplifier circuits; and a bias control circuit.

The bias control circuit may be configured to feed the replica circuit with one or more DC biasing signals thereby maintaining at a constant value a replica DC current that may be consumed by the replica circuit, and maintaining at a fixed value a replica DC voltage of a replica output node of the replica circuit.

The replica circuit may be coupled the multiple linear power amplifier circuits and may be configured to supply DC voltage bias signals that force each linear power amplifier circuit of the multiple linear power amplifier circuits to consume a linear power amplifier circuit DC current that equals the replica DC current, when the linear power amplifier circuit may be fed with a linear power amplifier DC voltage that either equals the replica DC voltage or differs from the replica DC voltage by a fraction of the replica DC voltage.

Each linear power amplifier circuit may include a linear power amplifier transistor and wherein the replica circuit may include a replica transistor that may be ideally identical to the linear power amplifier transistor.

Each linear power amplifier circuit may include a cascode amplifier and wherein the replica circuit may include a replica cascode amplifier that may be ideally identical to the cascode amplifier.

The cascode amplifier may include an input stage amplifier that may be serially coupled to an output stage amplifier; wherein the replica cascode amplifier may include a replica input stage amplifier that may be serially coupled to a replica output stage amplifier; wherein the DC voltage bias signals may include (a) a first DC voltage bias signal that may be provided from the replica input stage amplifier to the input stage amplifier and (b) a second bias signal that may be provided from the replica output stage amplifier to the output stage amplifier.

The input stage amplifier may include a CMOS input transistor; wherein the output stage amplifier may include a CMOS output transistor; wherein the replica input stage amplifier may include a CMOS replica input transistor; and wherein the replica output stage amplifier may include a CMOS replica output transistor that may be coupled between the replica output node and a replica intermediate node.

The biasing control circuit may include a first control loop for maintaining the replica DC voltage at the fixed value, and a second control loop for maintaining fixed a replica intermediate DC voltage of the replica intermediate node.

Each one of the first control loop and the second control loop may include an error amplifier.

The fraction of the replica DC voltage does not exceed five, ten or fifteen percent of the replica DC voltage. The biasing control circuit may include an error amplifier that may be configured to maintain the replica DC voltage fixed at a value that may be smaller by a fraction of the replica DC voltage than the linear power amplifier DC voltage; wherein a first input of the error amplifier may be coupled to the replica output node and a second input of the error amplifier may be coupled to a first input node; wherein the first input node may be also coupled to a reference current source; wherein the reference current source may be configured to supply the replica DC current.

The biasing device may include a first bias control circuit resistor that may be configured to set a voltage level of the second input of the error amplifier; and a second bias control circuit resistor that may be configured to set the replica DC current.

The biasing device does not take feedback from the linear power amplifier.

There may be provided a method for direct current (DC) biasing a linear power amplifier that may include multiple linear power amplifier circuits that may be ideally identical to each other; wherein the method may include (a) feeding, by a biasing device, a replica circuit with one or more DC biasing signals thereby maintaining at a constant value a replica DC current that may be consumed by the replica circuit, and maintaining at a fixed value a replica DC voltage of a replica output node of the replica circuit; wherein the replica circuit may be a replica of a linear power amplifier circuit of the multiple linear power amplifier circuits; wherein the replica circuit may be coupled the multiple linear power amplifier circuits; and (b) supplying, by the replica circuit, supply DC voltage bias signals that force each linear power amplifier circuit of the multiple linear power amplifier circuits to consume a linear power amplifier circuit DC current that equals the replica DC current, when the linear power amplifier circuit may be fed with a linear power amplifier DC voltage that either equals the replica DC voltage or exceeds the replica DC voltage by a fraction of the replica DC voltage.

The cascode amplifier may include an input stage amplifier that may be serially coupled to an output stage amplifier; wherein the replica cascode amplifier may include a replica input stage amplifier that may be serially coupled to a replica output stage amplifier; and wherein the feeding the replica circuit with one or more DC biasing signals may include providing a first DC voltage bias signal from the replica input stage amplifier to the input stage amplifier, and providing a second bias signal from the replica output stage amplifier to the output stage amplifier.

The biasing control circuit may include a first control loop and a second control loop; and wherein the method may include maintaining, by the first control loop, the replica DC voltage at the fixed value, and maintaining, by the second control loop, fixed a replica intermediate DC voltage of the replica intermediate node.

The biasing control circuit may include an error amplifier; wherein the method may include maintaining, by the error amplifier, the replica DC voltage fixed at a value that may be smaller by a fraction of the replica DC voltage than the linear power amplifier DC voltage; wherein a first input of the error amplifier may be coupled to the replica output node and a second input of the error amplifier may be coupled to a first input node; wherein the first input node may be also coupled to a reference current source; wherein the method may include supplying, by the reference current source, the replica DC current.

The biasing device may include a first bias control circuit resistor and a second bias control circuit resistor; wherein the method may include setting a voltage level of the second input of the error amplifier by the first bias control circuit resistor and setting the replica DC current by the second bias control circuit resistor.

The method excludes (may not include) taking feedback from the linear power amplifier.

BRIEF DESCRIPTION OF THE DRAWINGS

In order to understand the invention and to see how it may be carried out in practice, a preferred embodiment will now be described, by way of non-limiting example only, with reference to the accompanying drawings.

FIG. 5 illustrates a method according to an embodiment of the invention.

DETAILED DESCRIPTION OF THE DRAWINGS

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the following specification, the invention will be described with reference to specific examples of embodiments of the invention. It will, however, be evident that various modifications and changes may be made therein without departing from the broader spirit and scope of the invention as set forth in the appended claims.

Figure 1:
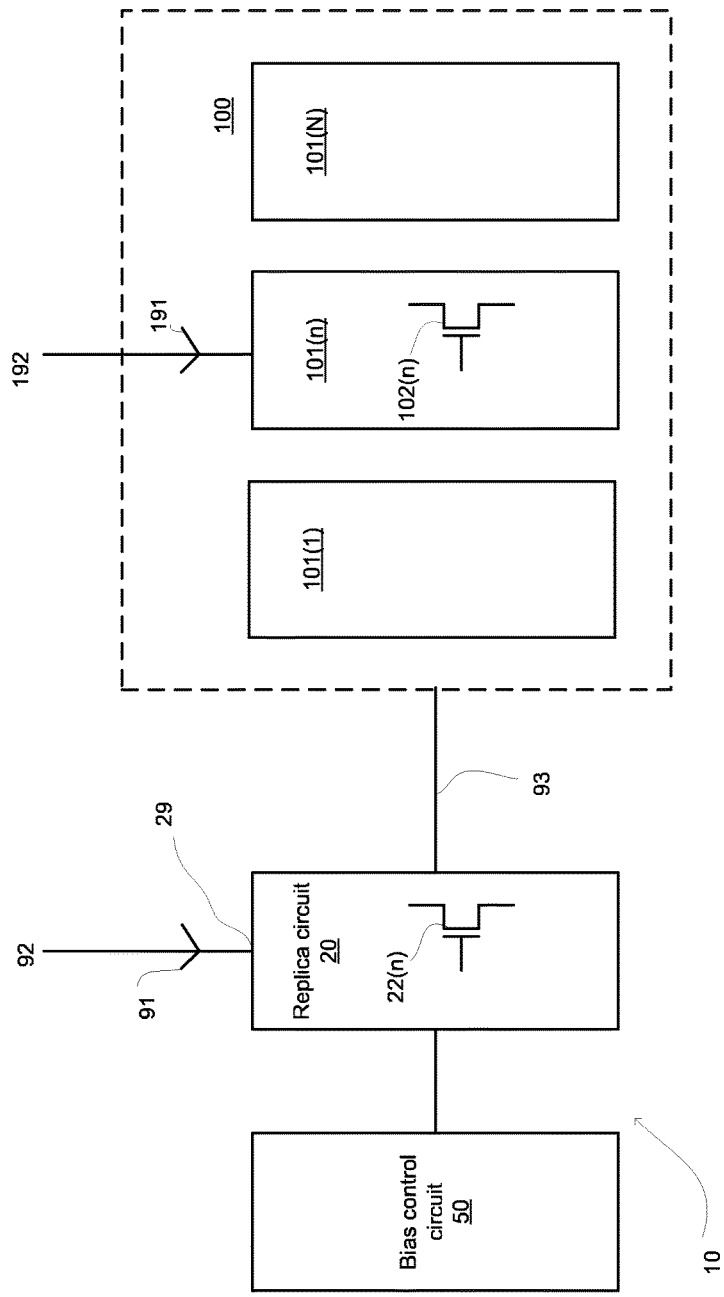
FIG. 1 illustrates a biasing device and a linear power amplifier according to an embodiment of the invention.

FIG. 1 illustrates a biasing device 10 and a linear power amplifier 100 according to an embodiment of the invention.

Biasing device 10 is configured to DC bias the linear power amplifier 100.

The linear power amplifier 100 may include multiple linear power amplifier circuits 101(1)-101(N) that are ideally identical to each other. N may exceed one. For index n that ranges between 1 and N the n'th linear power amplifier circuit is denoted 101(n).

The linear power amplifier circuits are ideally identical in the sense that they have the same design and are expected to differ from each other by a tolerable amount. The tolerable amount may be defined by the manufacturing process, may be set by a designer, a manufacturer and/or user of the linear power amplifier, and the like.

Each linear power amplifier circuit may include one or more transistors such as but not limited to CMOS transistors. In FIG. 1 the linear power amplifier circuit 101(n) is illustrates as including transistor 102(n).

Some of the following figures illustrate each power amplifier circuit as being a cascode amplifier—but this is merely a non-limiting example of a power amplifier circuit.

Biasing device 10 includes a replica circuit 20 that is a replica of a linear power amplifier circuit of the multiple linear power amplifier circuits and bias control circuit 50.

Replica circuit 20 is ideally identical to each linear power amplifier circuit. The replica circuit 20 is ideally identical to each linear power amplifier circuit in the sense that they have the same design and are expected to differ from each other by a tolerable amount.

It may be beneficial that the replica circuit 20 is subjected to the same (or almost the same) temperature and process variations as the linear power amplifier circuit. This may be obtained, for example, by positioning the replica circuit as close as possible to the linear power amplifier circuits. The linear power amplifier circuits may form an array and the replica circuit may be part of the array. The replica circuit may be positioned between two of the linear power amplifier circuit. The distance between the replica circuit and one or more of the linear power amplifier circuits may not exceed, for example, 1, 10, 20, 50, 100, 200, 300, 400, 500, 600, 700, 800, 900, 1000, 1100, 1200, 1300, 1400 millimeters.

An allowable temperature difference and/or an allowable process variation difference may be defined between the replica circuit and a linear power amplifier circuit.

For a given a temperature distribution, the distance may be set so that the temperature difference between the replica circuit and the linear power amplifier circuit does not exceed the allowable temperature difference.

For a given a process variation distribution, the distance may be set so that the process variation difference between the replica circuit and the linear power amplifier circuit does not exceed the allowable process variation difference.

The temperature distribution and/or the process variation distribution may be estimated or measured in any manner known in the art.

The bias control circuit 50 is configured to feed the replica circuit 20 with one or more DC biasing signals thereby maintaining at a constant value a replica DC current 91 that is consumed by the replica circuit 20, and maintaining at a fixed value a replica DC voltage 92 of a replica output node 29 of the replica circuit 20.

The replica circuit 20 is coupled the multiple linear power amplifier circuits 101(1)-101(N) and is configured to supply DC voltage bias signals 93 that force each linear power amplifier circuit 101(n) to consume a linear power amplifier circuit DC current 191 that equals the replica DC current 91—when the linear power amplifier circuit 101(n) is fed with a linear power amplifier circuit DC voltage 192 that either equals the replica DC voltage 92 or exceeds the replica DC voltage 92 by a fraction of the replica DC voltage.

The fraction may range, for example, between 1 and 30 percent, may ranges, for example between 0.01 and 1 volts, and the like.

Each linear power amplifier circuit 101(n) may include one or more transistors (referred to as linear power amplifier transistors 102(n)). The replica circuit 20 may include one or more transistors (referred to as replica transistors 22(n)) that are ideally identical to the one or more linear power amplifier transistors.

Figure 2:
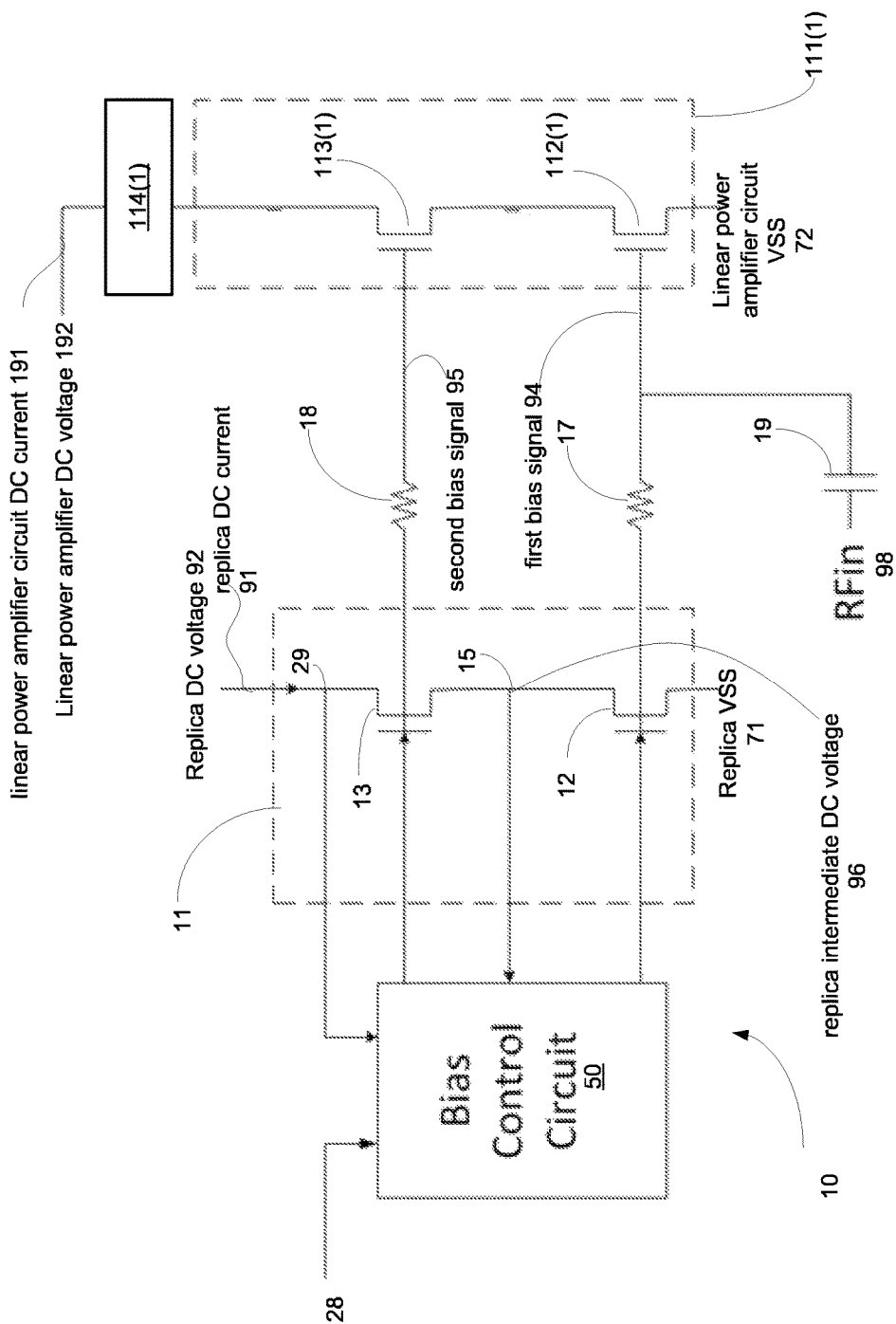
FIG. 2 illustrates a biasing device and a linear power amplifier according to an embodiment of the invention.

FIG. 2 illustrates a biasing device 10 and a linear power amplifier 100 according to an embodiment of the invention.

Biasing device 10 includes a replica cascode amplifier 11 and a linear power amplifier 100 that includes a cascode amplifier 111(1).

For simplicity of explanation only a single cascode amplifier 111(1) is shown although the linear power amplifier 100 may include one or more others cascode amplifiers.

Furthermore—in FIG. 2 various input and output stage amplifiers are illustrated as CMOS transistors.

The cascode amplifier 111(1) includes an input stage amplifier 112(1) that is serially coupled to an output stage amplifier 113(1). The output stage amplifier 113(1) is coupled, via inductive load 114(1) to a power supply that supplies a linear power amplifier circuit DC voltage 192.

The input stage amplifier 112(1) is connected to a reference voltage (that may be zero voltage or any other voltage) that is denoted linear power amplifier circuit Vss 72.

The replica cascode amplifier 11 includes a replica input stage amplifier 12 that is serially coupled (via replica intermediate node 15) to a replica output stage amplifier 13. The replica output stage amplifier 13 is coupled to a power supply that supplies a replica DC voltage 92.

The replica input stage amplifier 12 is connected to a reference voltage (that may be zero voltage or any other voltage) that is denoted replica Vss 71.

The DC voltage bias signals include a first bias signal 94 that is provided from the replica input stage amplifier 12 to the input stage amplifier 112(1) and a second bias signal 95 that is provided from the replica output stage amplifier 13 to the output stage amplifier 113(1).

First bias signal 94 and second bias signal 95 may be provided over any networks.

In FIG. 2 the first bias signal 94 is provided over a network that includes first bias resistor 17. The network also includes an input capacitor 19 over which a radio frequency signal (RFin) 98 is provided to the input stage amplifier 112(1).

In FIG. 2 the second bias signal 95 is provided over a network that includes second bias resistor 18. The network may also include a capacitor that is connected between the second bias resistor and the ground.

In FIG. 2 a reference current source (not shown) provides a fixed valued replica DC current 91 to replica output node 29. The value of the replica DC current 91 may be set to desired value.

Bias control circuit 50 may include a first control loop for maintaining the replica DC voltage at the fixed value, and a second control loop for maintaining fixed a replica intermediate DC voltage 96 of the replica intermediate node 15. The first and second control loops may work independently from each other or may be influenced from each other.

The replica intermediate DC voltage 96 is lower than the replica DC voltage 92 and may be set to any desired value below the replica DC voltage 92. The replica intermediate DC voltage 96 may be set to a value that protects the input and/or output stage amplifiers.

Figure 3:
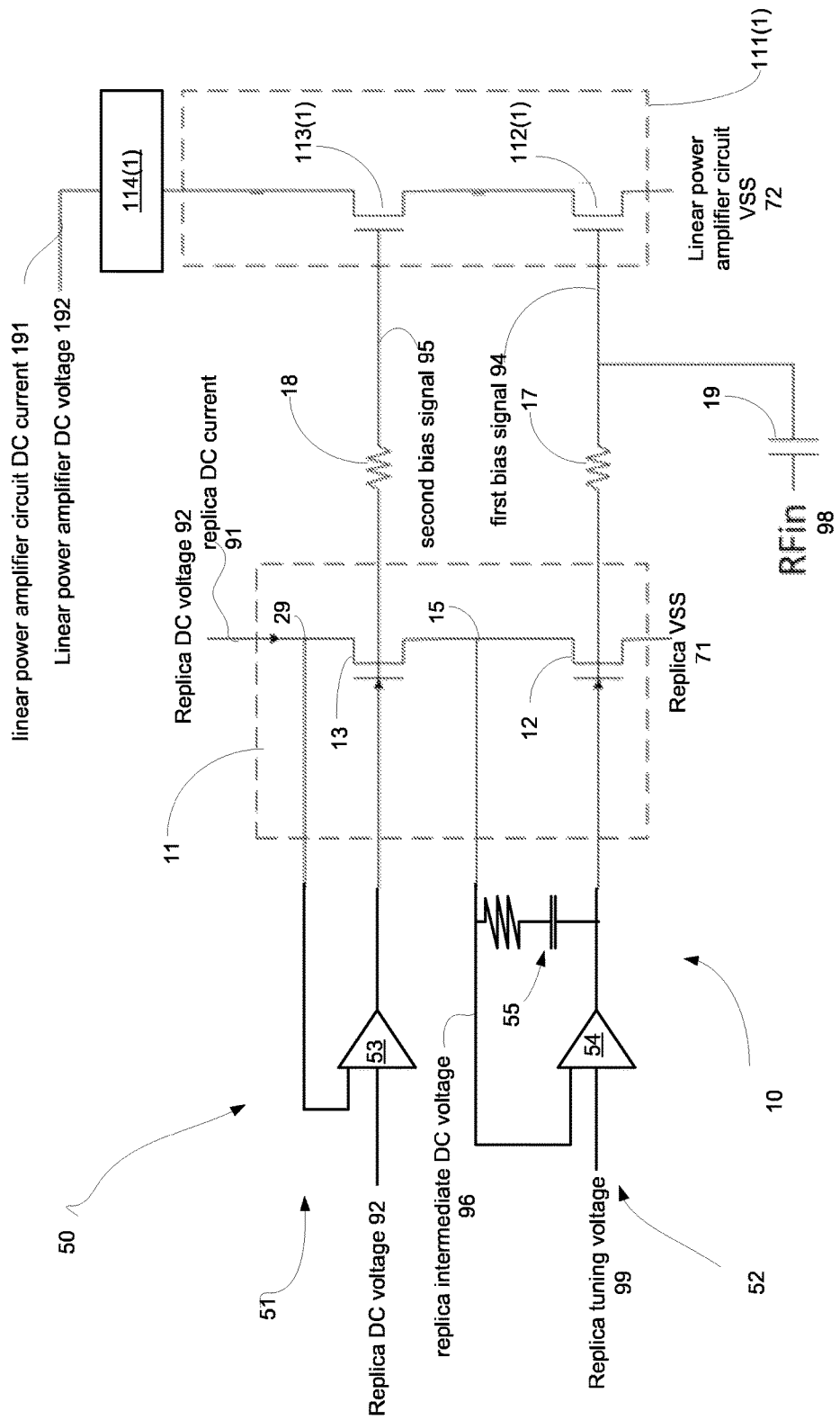
FIG. 3 illustrates a biasing device and a linear power amplifier according to an embodiment of the invention.

FIG. 3 illustrates a biasing device 10 and a linear power amplifier 100 according to an embodiment of the invention.

Biasing device 10 has a first control loop 51 that includes a first error amplifier 53 and the second control loop 52 that includes a second error amplifier 54. The second control loop 52 may also include a capacitor-resistor (RC) network 55.

A first input of the first error amplifier 53 is coupled to the replica output node 29. A second input of the first error amplifier 53 receives (from a voltage supply unit) the replica DC voltage 92. The first error amplifier 53 aims to nullify the difference (error) between replica DC voltage 92 and the voltage at the replica output node 29—thereby maintaining the voltage at the replica output node 29 at a fixed value that equals replica DC voltage 92.

A first input of the second error amplifier 54 is coupled to the replica intermediate node 15. A second input of the second error amplifier 54 receives (from a voltage supply unit) a replica tuning voltage 99. The second error amplifier 54 aims to nullify the difference (error) between replica tuning voltage 99 and the voltage at the replica intermediate node 15—thereby maintaining the voltage at the replica intermediate node 15 at a fixed value that equals replica tuning voltage 99—which is set to a desired value of the voltage of the replica intermediate node 15.

Figure 4:
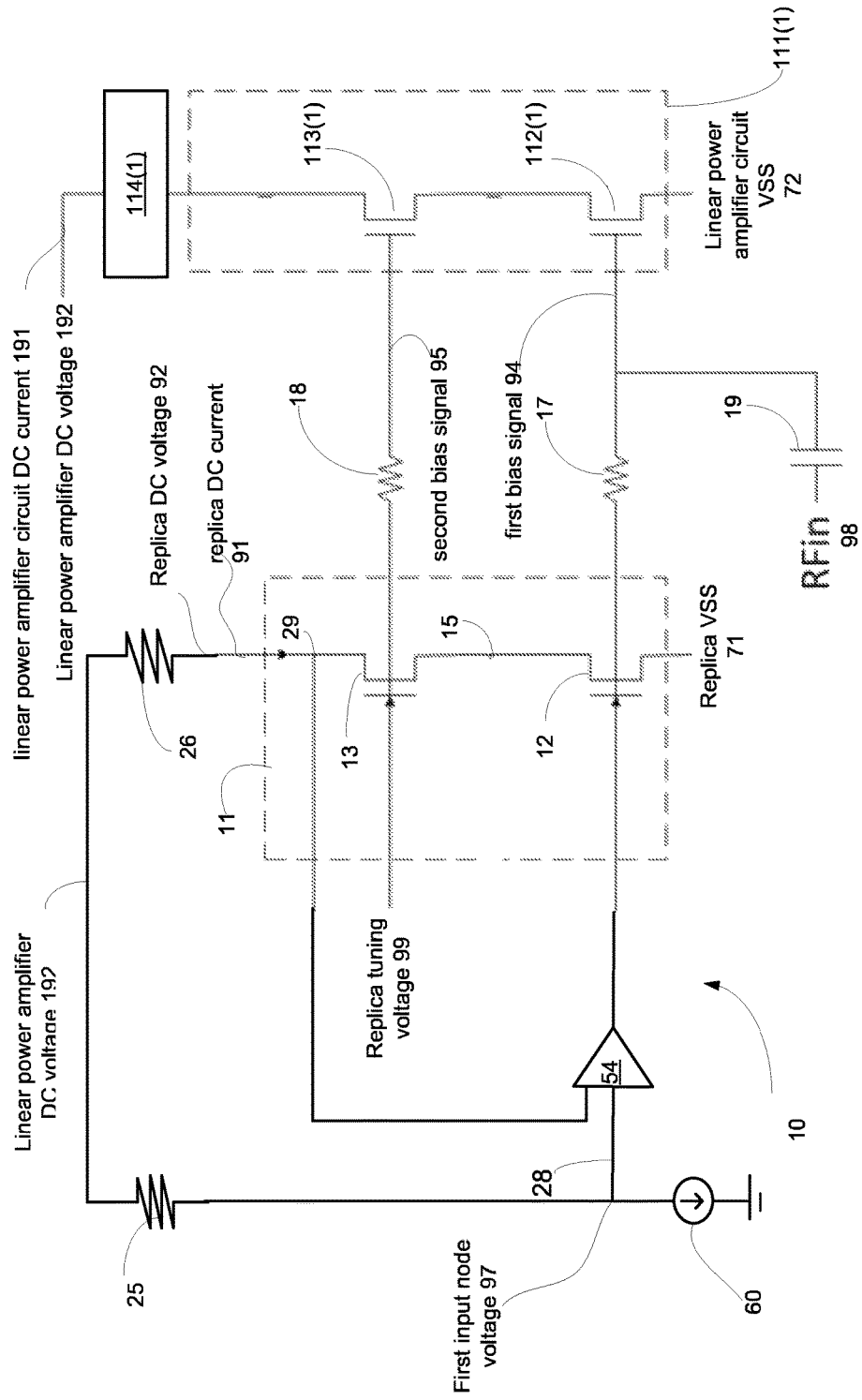
FIG. 4 illustrates a biasing device and a linear power amplifier according to an embodiment of the invention.

FIG. 4 illustrates a biasing device 10 and a linear power amplifier 100 according to an embodiment of the invention.

It is assumed that the highest DC voltage that is supplied to the biasing device is the linear power amplifier circuit DC voltage 192—and that the replica DC voltage 92 (at replica output node 29) is lower (by a fraction of the replica DC voltage) than the linear power amplifier DC voltage. It may be beneficial that the difference between the replica DC voltage 92 and the linear power amplifier circuit DC voltage 192 is small as possible—while facilitating the operation of the biasing device 10.

The bias control circuit 50 includes a first bias control circuit resistor 25, a second bias control circuit resistor 26, reference current source 60 and second error amplifier 54.

A first input of the second error amplifier 54 is connected to first input node 28.

A second input of the second error amplifier 54 is connected to the replica output node 29.

The reference current source 60 is also connected to the first input node 28. The first bias control circuit resistor 25 is connected between the first input node and a voltage supply that supplies linear power amplifier circuit DC voltage 192.

The second bias control circuit resistor 26 is connected between replica output node 29 and the voltage supply that supplies linear power amplifier circuit DC voltage 192.

The voltage of the first input node 28 (referred to as first input node voltage 97) is set by the first bias control circuit resistor 25 while the replica DC current 91 from the reference current source 60 flows through the first bias control circuit resistor.

The second bias control circuit resistor 26 sets the replica DC current 91 that flows through the second bias control circuit resistor 26.

The second error amplifier 54 aims to nullify the difference (error) between the voltage at the replica output node 29 (replica DC voltage 92) and the first input node voltage 97—thereby maintaining the replica DC voltage 92 at a fixed value that equals the first input node voltage 97.

The gate of replica output stage amplifier 13 receives replica tuning voltage 99 that may be set to any value.

In FIGS. 1-4 the bias control circuit does not drain (or at least does not substantially drain) any current from the replica output node 29 and does not receive any feedback from the linear power amplifier circuits.

The similarity between the replica circuit and the linear power amplifier circuit causes that the provision of the bias signals (DC voltage signals) to the linear power amplifiers (as well as the provision of the same or substantially the same supply voltage to the replica circuit and the linear power amplifier circuits) forces each one of the linear power amplifier circuits to consume the same current as the replica DC current while receiving the same voltages as the voltages of the replica circuit (for example—the voltages at the gates of the amplifiers, the voltages at intermediated nodes, and the supply voltages). In general—where there are N linear power amplifier circuits they these N linear power amplifier circuits consume N times the replica DC current—each linear power amplifier circuit consume the replica DC current.

The bias control circuit of any of the figures operates without obtaining feedback from the linear amplifiers circuits thereby improves the performance of the linear amplifier circuits.

Furthermore, in this method one can adjust Iref to achieve temperature/process dependency with additional circuitry to gain better control on the PA operation. The value of Iref may be set based on the sensed or evaluated temperature.

A method may be provided for utilizing and/or manufacturing and/or assembling an apparatus as illustrated in the figures above.

FIG. 5 illustrates method 200 according to an embodiment of the invention.

Method 200 is for direct current (DC) biasing a linear power amplifier that includes multiple linear power amplifier circuits that are ideally identical to each other.

Method 200 may start by step 210 of feeding, by a biasing device, a replica circuit with one or more DC biasing signals thereby maintaining at a constant value a replica DC current that is consumed by the replica circuit, and maintaining at a fixed value a replica DC voltage of a replica output node of the replica circuit; wherein the replica circuit is a replica of a linear power amplifier circuit of the multiple linear power amplifier circuits; wherein the replica circuit is coupled the multiple linear power amplifier circuits.

Step 210 may be followed by step 220 of supplying, by the replica circuit, supply DC voltage bias signals that force each linear power amplifier circuit of the multiple linear power amplifier circuits to consume a linear power amplifier circuit DC current that equals the replica DC current, when the linear power amplifier circuit is fed with a linear power amplifier DC voltage that either equals the replica DC voltage or exceeds the replica DC voltage by a fraction of the replica DC voltage.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations, and alternatives are also possible. The specifications and drawings are, accordingly, to be regarded in an illustrative rather than in a restrictive sense.

The word "comprising" does not exclude the presence of other elements or steps then those listed in a claim. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe.

Thus, these terms are not necessarily intended to indicate temporal or other prioritization of such elements. The mere fact that certain measures are recited in mutually different claims does not indicate that a combination of these measures cannot be used to advantage.

We claim:

1. A biasing device for direct current (DC) biasing a linear power amplifier that comprises multiple linear power amplifier circuits that are ideally identical to each other; wherein the biasing device comprises:
    a replica circuit that is a replica of a linear power amplifier circuit of the multiple linear power amplifier circuits; and
    a bias control circuit;
    wherein the bias control circuit is configured to feed the replica circuit with one or more DC biasing signals thereby maintaining at a constant value a replica DC current that is consumed by the replica circuit, and maintaining at a fixed value a replica DC voltage of a replica output node of the replica circuit; and wherein the replica circuit is coupled the multiple linear power amplifier circuits and is configured to supply DC voltage bias signals that force each linear power amplifier circuit of the multiple linear power amplifier circuits to consume a linear power amplifier circuit DC current that equals the replica DC current, when the linear power amplifier circuit is fed with a linear power amplifier DC voltage that either equals the replica DC voltage or differs from the replica DC voltage by a fraction of the replica DC voltage;

wherein each linear power amplifier circuit comprises a cascode amplifier and wherein the replica circuit comprises a replica cascode amplifier that is ideally identical to the cascode amplifier;

wherein the cascode amplifier comprises an input stage amplifier that is serially coupled to an output stage amplifier; wherein the replica cascode amplifier comprises a replica input stage amplifier that is serially coupled to a replica output stage amplifier; wherein the DC voltage bias signals comprises (a) a first DC voltage bias signal that is provided from the replica input stage amplifier to the input stage amplifier and (b) a second bias signal that is provided from the replica output stage amplifier to the output stage amplifier; wherein the input stage amplifier comprises a CMOS input transistor; wherein the output stage amplifier comprises a CMOS output transistor; wherein the replica input stage amplifier comprises a CMOS replica input transistor; and wherein the replica output stage amplifier comprises a CMOS replica output transistor that is coupled between the replica output node and a replica intermediate node.

2. The biasing device according to claim 1 wherein each linear power amplifier circuit comprises a linear power amplifier transistor and wherein the replica circuit comprises a replica transistor that is ideally identical to the linear power amplifier transistor.

3. The biasing device according to claim 1 wherein the biasing control circuit comprises a first control loop for maintaining the replica DC voltage at the fixed value, and a second control loop for maintaining fixed a replica intermediate DC voltage of the replica intermediate node.

4. The biasing device according to claim 3 wherein each one of the first control loop and the second control loop comprises an error amplifier.

5. A biasing device for direct current (DC) biasing a linear power amplifier that comprises multiple linear power amplifier circuits that are ideally identical to each other; wherein the biasing device comprises: a replica circuit that is a replica of a linear power amplifier circuit of the multiple linear power amplifier circuits; and a bias control circuit; wherein the bias control circuit is configured to feed the replica circuit with one or more DC biasing signals thereby maintaining at a constant value a replica DC current that is consumed by the replica circuit, and maintaining at a fixed value a replica DC voltage of a replica output node of the replica circuit; wherein the replica circuit is coupled the multiple linear power amplifier circuits and is configured to supply DC voltage bias signals that force each linear power amplifier circuit of the multiple linear power amplifier circuits to consume a linear power amplifier circuit DC current that equals the replica DC current, when the linear power amplifier circuit is fed with a linear power amplifier DC voltage that either equals the replica DC voltage or differs from the replica DC voltage by a fraction of the replica DC voltage wherein the fraction of the replica DC voltage does not exceed 10% of the replica DC voltage.

6. A biasing device for direct current (DC) biasing a linear power amplifier that comprises multiple linear power amplifier circuits that are ideally identical to each other; wherein the biasing device comprises: a replica circuit that is a replica of a linear power amplifier circuit of the multiple linear power amplifier circuits; and a bias control circuit; wherein the bias control circuit is configured to feed the replica circuit with one or more DC biasing signals thereby maintaining at a constant value a replica DC current that is consumed by the replica circuit, and maintaining at a fixed value a replica DC voltage of a replica output node of the replica circuit; wherein the replica circuit is coupled the multiple linear power amplifier circuits and is configured to supply DC voltage bias signals that force each linear power amplifier circuit of the multiple linear power amplifier circuits to consume a linear power amplifier circuit DC current that equals the replica DC current, when the linear power amplifier circuit is fed with a linear power amplifier DC voltage that either equals the replica DC voltage or differs from the replica DC voltage by a fraction of the replica DC voltage; wherein the biasing control circuit comprises an error amplifier that is configured to maintain the replica DC voltage fixed at a value that is smaller by the fraction of the replica DC voltage than the linear power amplifier DC voltage; wherein a first input of the error amplifier is coupled to the replica output node and a second input of the error amplifier is coupled to a first input node; wherein the first input node is also coupled to a reference current source; wherein the reference current source is configured to supply the replica DC current.

7. The biasing device according to claim 6, comprising a first bias control circuit resistor that is configured to set a voltage level of the second input of the error amplifier; and a second bias control circuit resistor that is configured to set the replica DC current.

8. The biasing device according to claim 1, wherein the biasing device does not take feedback from the linear power amplifier.

9. A method for direct current (DC) biasing a linear power amplifier that comprises multiple linear power amplifier circuits that are ideally identical to each other; wherein the method comprises:

feeding, by a biasing device, a replica circuit with one or more DC biasing signals thereby maintaining at a constant value a replica DC current that is consumed by the replica circuit, and maintaining at a fixed value a replica DC voltage of a replica output node of the replica circuit; wherein the replica circuit is a replica of a linear power amplifier circuit of the multiple linear power amplifier circuits; wherein the replica circuit is coupled the multiple linear power amplifier circuits; and supplying, by the replica circuit, supply DC voltage bias signals that force each linear power amplifier circuit of the multiple linear power amplifier circuits to consume a linear power amplifier circuit DC current that equals the replica DC current, when the linear power amplifier circuit is fed with a linear power amplifier DC voltage that either equals the replica DC voltage or exceeds the replica DC voltage by a fraction of the replica DC voltage;

wherein each linear power amplifier circuit comprises a cascode amplifier and wherein the replica circuit comprises a replica cascode amplifier that is ideally identical to the cascode amplifier;

wherein the cascode amplifier comprises an input stage amplifier that is serially coupled to an output stage amplifier; wherein the replica cascode amplifier comprises a replica input stage amplifier that is serially coupled to a replica output stage amplifier; and wherein the feeding the replica circuit with one or more DC biasing signals comprises providing a first DC voltage bias signal from the replica input stage amplifier to the input stage amplifier, and providing a second bias signal from the replica output stage amplifier to the output stage amplifier.

10. The method according to claim 9 wherein each linear power amplifier circuit comprises a linear power amplifier transistor and wherein the replica circuit comprises a replica transistor that is ideally identical to the linear power amplifier transistor.

11. The method according to claim 9, wherein the input stage amplifier comprises a CMOS input transistor; wherein the output stage amplifier comprises a CMOS output transistor; wherein the replica input stage amplifier comprises a CMOS replica input transistor; and wherein the replica output stage amplifier comprises a CMOS replica output transistor that is coupled between the replica output node and a replica intermediate node.

12. The method according to claim 11 wherein the biasing device comprises a first control loop and a second control loop; and wherein the method comprises maintaining, by the first control loop, the replica DC voltage at the fixed value, and maintaining, by the second control loop, fixed a replica intermediate DC voltage of the replica intermediate node.

13. The method according to claim 12 wherein each one of the first control loop and the second control loop comprises an error amplifier.

14. A method for direct current (DC) biasing a linear power amplifier that comprises multiple linear power amplifier circuits that are ideally identical to each other; wherein the method comprises: feeding, by a biasing device, a replica circuit with one or more DC biasing signals thereby maintaining at a constant value a replica DC current that is consumed by the replica circuit, and maintaining at a fixed value a replica DC voltage of a replica output node of the replica circuit; wherein the replica circuit is a replica of a linear power amplifier circuit of the multiple linear power amplifier circuits; wherein the replica circuit is coupled the multiple linear power amplifier circuits; and supplying, by the replica circuit, supply DC voltage bias signals that force each linear power amplifier circuit of the multiple linear power amplifier circuits to consume a linear power amplifier circuit DC current that equals the replica DC current, when the linear power amplifier circuit is fed with a linear power amplifier DC voltage that either equals the replica DC voltage or exceeds the replica DC voltage by a fraction of the replica DC voltage; wherein the fraction of the replica DC voltage does not exceed 10% of the replica DC voltage.

15. A method for direct current (DC) biasing a linear power amplifier that comprises multiple linear power amplifier circuits that are ideally identical to each other; wherein the method comprises: feeding, by a biasing device, a replica circuit with one or more DC biasing signals thereby maintaining at a constant value a replica DC current that is consumed by the replica circuit, and maintaining at a fixed value a replica DC voltage of a replica output node of the replica circuit; wherein the replica circuit is a replica of a linear power amplifier circuit of the multiple linear power amplifier circuits; wherein the replica circuit is coupled the multiple linear power amplifier circuits; and supplying, by the replica circuit, supply DC voltage bias signals that force each linear power amplifier circuit of the multiple linear power amplifier circuits to consume a linear power amplifier circuit DC current that equals the replica DC current, when the linear power amplifier circuit is fed with a linear power amplifier DC voltage that either equals the replica DC voltage or exceeds the replica DC voltage by a fraction of the replica DC voltage; wherein the biasing device comprises an error amplifier; wherein the method comprises maintaining, by the error amplifier, the replica DC voltage fixed at a value that is smaller by the fraction of the replica DC voltage than the linear power amplifier DC voltage; wherein a first input of the error amplifier is coupled to the replica output node and a second input of the error amplifier is coupled to a first input node; wherein the first input node is also coupled to a reference current source; wherein the method comprises supplying, by the reference current source, the replica DC current.

16. The method according to claim 15, wherein the biasing device comprising a first bias control circuit resistor and a second bias control circuit resistor;

wherein the method comprises:
setting a voltage level of the second input of the error amplifier by the first bias control circuit resistor; and
setting the replica DC current by the second bias control circuit resistor.

17. The method according to claim 9, wherein the method excludes taking feedback from the linear power amplifier.

18. The biasing device according to claim 6 wherein the fraction of the replica of the DC voltage ranges between 1 and thirty percent of the replica of the DC voltage.

19. The method according to claim 15 wherein the fraction of the replica of the DC voltage ranges between 1 and thirty percent of the replica of the DC voltage.

* * * * *